(12) United States Patent
Shibata et al.

(10) Patent No.: US 12,315,760 B2
(45) Date of Patent: May 27, 2025

(54) METHOD FOR MANUFACTURING ELECTRONIC COMPONENT DEVICE

(71) Applicant: Showa Denko Materials Co., Ltd., Tokyo (JP)

(72) Inventors: Tomoaki Shibata, Tokyo (JP); Tsuyoshi Ogawa, Tokyo (JP); Xinrong Li, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 700 days.

(21) Appl. No.: 17/435,630

(22) PCT Filed: Mar. 5, 2020

(86) PCT No.: PCT/JP2020/009472
§ 371 (c)(1),
(2) Date: Sep. 1, 2021

(87) PCT Pub. No.: WO2020/179874
PCT Pub. Date: Sep. 10, 2020

(65) Prior Publication Data
US 2022/0148914 A1 May 12, 2022

(30) Foreign Application Priority Data
Mar. 6, 2019 (JP) .................................. 2019-040656

(51) Int. Cl.
*H01L 21/768* (2006.01)
(52) U.S. Cl.
CPC .. *H01L 21/76817* (2013.01); *H01L 21/76877* (2013.01)

(58) Field of Classification Search
CPC ...................... H01L 21/76817; H01L 21/7687
See application file for complete search history.

(56) References Cited

U.S. PATENT DOCUMENTS

| | | | |
|---|---|---|---|
| 2013/0009319 A1 | 1/2013 | Shao | |
| 2013/0299219 A1* | 11/2013 | Chisaka | H05K 1/092 174/257 |
| 2015/0279804 A1 | 10/2015 | Raravikar et al. | |
| 2018/0061735 A1* | 3/2018 | Matsubara | H01L 23/295 |
| 2018/0240760 A1* | 8/2018 | Kasai | H01L 23/12 |
| 2018/0366410 A1 | 12/2018 | Chen et al. | |
| 2019/0011831 A1* | 1/2019 | Li | H10K 71/18 |
| 2019/0098743 A1* | 3/2019 | Molla | H01L 23/3735 |
| 2020/0273830 A1* | 8/2020 | Kwon | H01L 21/76877 |

FOREIGN PATENT DOCUMENTS

| | | |
|---|---|---|
| JP | 2001-513946 A | 9/2001 |
| JP | 2005-093767 A | 4/2005 |
| JP | 2005-203614 A | 7/2005 |
| JP | 2010-103517 A | 5/2010 |
| JP | 5884477 B2 | 3/2016 |
| JP | 2017-222930 A | 12/2017 |

\* cited by examiner

*Primary Examiner* — Jay C Chang
(74) *Attorney, Agent, or Firm* — FITCH, EVEN, TABIN & FLANNERY, LLP

(57) ABSTRACT

Disclosed is a method for manufacturing an electronic component including: forming a via hole extending in a thickness direction of a curable sealing resin layer provided on a base material by an imprint method of pressing a mold into the sealing resin layer from a side opposite to the base material; curing the sealing resin layer; filling the via hole with a conductor precursor; and forming a conductive via by heating the conductor precursor filled in the via hole.

10 Claims, 5 Drawing Sheets

METHOD FOR MANUFACTURING ELECTRONIC COMPONENT DEVICE

CROSS-REFERENCE TO RELATED APPLICATIONS

This application is a U.S. national phase application filed under 35 U.S.C. § 371 of International Application No. PCT/JP2020/009472, filed Mar. 5, 2020, designating the United States, which claims priority Japanese Application No. 2019-040656, filed Mar. 6, 2019, which are hereby incorporated herein by reference in their entirety.

TECHNICAL FIELD

The present invention relates to a method of manufacturing an electronic component device.

BACKGROUND ART

In a semiconductor device in which a plurality of semiconductor elements are stacked, a conductive via penetrating a sealing resin layer for sealing the semiconductor element may be provided (for example, Patent Document 1).

Conventional methods of forming conductive vias through sealing resin layers generally include a step of electrolytic plating. FIG. 5 is a process diagram showing an example of a conventional method of forming a conductive via. The method shown in FIG. 5 includes a step (a) of forming a seed layer 11 on a substrate 1, a step (b) of forming a resist film 13 having an opening exposing the seed layer 11 on the seed layer 11 by photolithography, a step (c) of forming a copper plating layer 15 on the seed layer 11 in the opening by electroplating, a step (d) of peeling off the resist film 13, a step (e) of removing a portion of the seed layer 11 where the copper plating layer 15 is not formed, and a step (f) of forming a sealing resin layer 3 filling the periphery of conductive via 5 consisting of the seed layer 11 and the copper plating layer 15.

CITATION LIST

Patent Literature

[Patent Document 1] Japanese Patent No. 5884477

SUMMARY OF INVENTION

Technical Problem

Since the conventional method of forming the conductive via penetrating a sealing resin layer includes a plurality of processes as illustrated in FIG. 5, it is difficult to improve production efficiency. In particular, it is generally difficult to form a conductive via having a small width and a certain height by electroplating.

An aspect of the present invention provides a method for efficiently and easily manufacturing an electronic component device having a conductive via penetrating a sealing resin layer with a small number of processes.

Solution to Problem

An aspect of the present invention relates to a method for manufacturing an electronic component device, the method including: forming a via hole extending in a thickness direction of a curable sealing resin layer provided on a base material by an imprint method of pressing a mold into the sealing resin layer from a side opposite to the base material; curing the sealing resin layer; filling the via hole with a conductor precursor; and forming a conductive via by heating the conductor precursor filled in the via hole.

Advantageous Effects of Invention

According to an aspect of the present invention, it is possible to efficiently and easily manufacture an electronic component device having a conductive via penetrating a sealing resin layer with a small number of steps. The method according to an aspect of the present invention is also advantageous in that a plurality of via holes for forming conductive vias can be collectively formed without treatment at a high temperature.

DESCRIPTION OF EMBODIMENTS

Hereinafter, some embodiments of the present invention will be described in detail. However, the present invention is not limited to the following embodiments.

Figure 1:
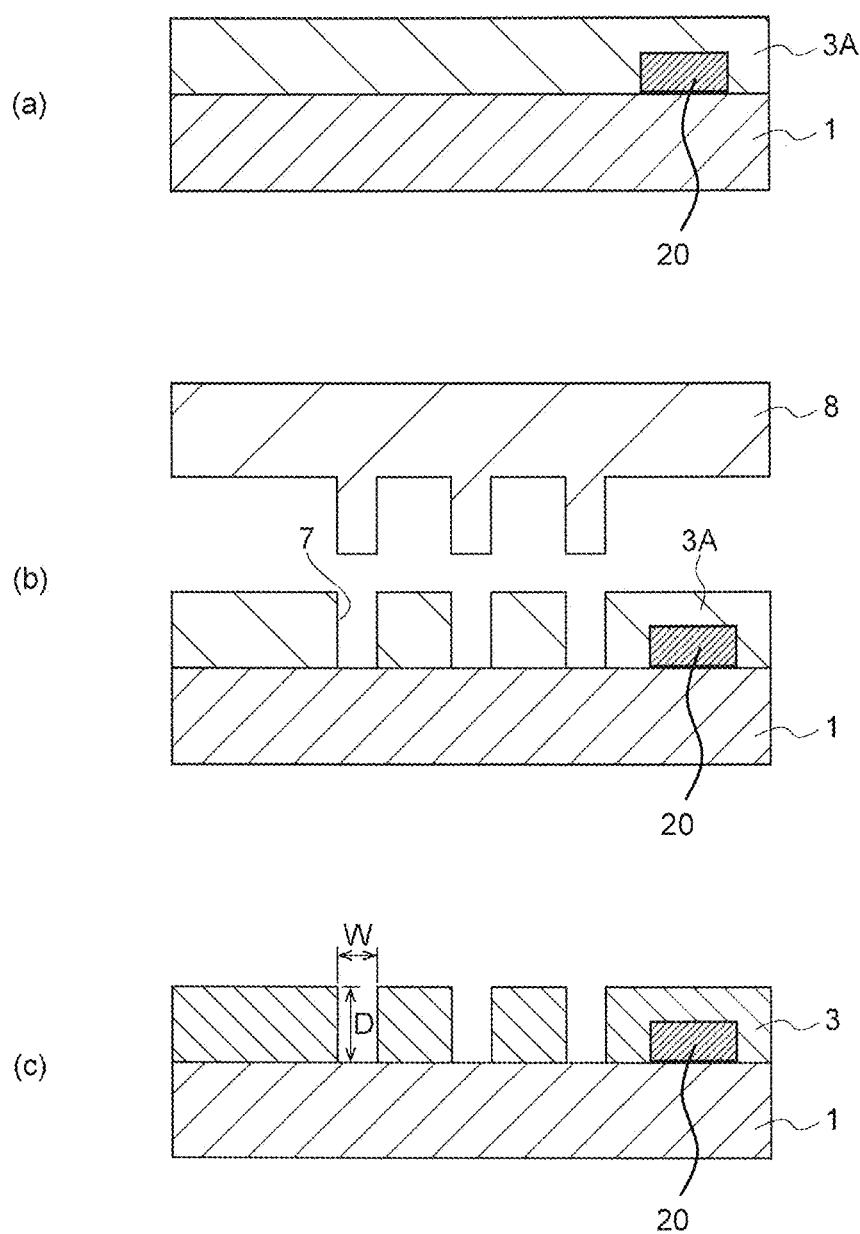
FIG. 1 is a process diagram showing an embodiment of a method of manufacturing an electronic component device.
Figure 2:
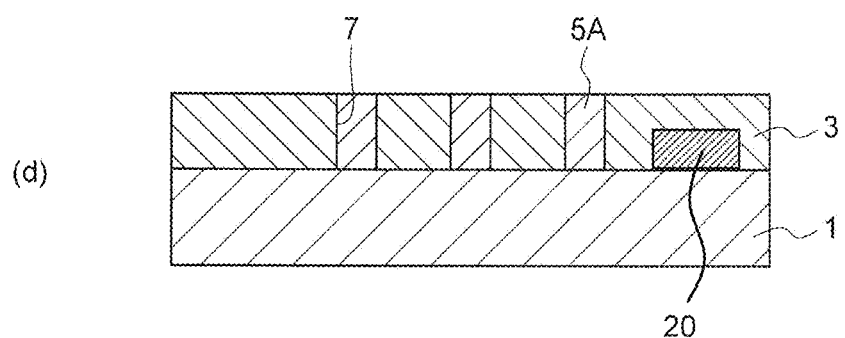
FIG. 2 is a process diagram showing an embodiment of a method of manufacturing an electronic component device.
Figure 2:
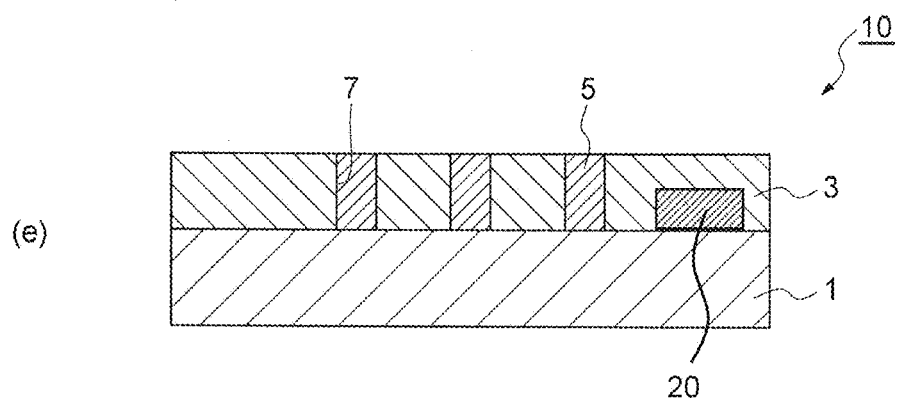

FIGS. 1 and 2 are process diagrams showing an embodiment of a method of manufacturing an electronic component device. The process shown in FIGS. 1 and 2 includes a step (a) of forming a curable sealing resin layer 3A provided on a base material 1, a step (b) of forming a via hole 7 extending in the thickness direction of the sealing resin layer 3A by an imprint process of pressing a mold 8 into the sealing resin layer 3A from the side opposite to the base material 1, a step (c) of curing the sealing resin layer 3A to form a cured sealing resin layer 3A, a step (d) of filling a conductor precursor 5A in the via hole 7, and a step (e) of forming a conductive via 5 by heating the conductor precursor 5A filled in the via hole 7.

The cured sealing resin layer 3 is a layer for sealing an electronic component such as a semiconductor element 20, and is a cured product formed of a curable resin. In the step of forming the via hole 7 by the imprint method, the sealing resin layer 3A is not cured or is partially cured to such an extent as to leave fluidity capable of forming the via hole. In other words, the sealing resin layer 3A may be in the B stage state.

The sealing resin layer 3A may be formed using a sealing material that is generally used to seal an electronic component 20. For example, a film-shaped sealing material may be laminated on the base material 1 as the sealing resin layer 3A. Generally, an electronic component 20 is disposed on the base material 1 in advance, and a sealing resin layer 3A is formed to cover the electronic component 20 on the base material 1.

In the imprint method, a mold 8 having protrusions corresponding to the via holes 7 is used. The protrusion of the mold 8 is pressed against the sealing resin layer 3A, while the sealing resin layer 3A, the mold 8, or both are heated as necessary. It is not necessary that the mold 8 reaches the base material 1 and the via hole 7 penetrating the sealing resin layer 3A is formed, and the sealing resin layer 3A may remain at the bottom of the via hole 7. The mold 8 is not particularly limited, and may be made of, for example, silicon or metal.

The depth D of the via hole 7 (or the height of the conductive via 5) may be 30 to 500 μm. The maximum width W of the via hole 7 (or the maximum width of the conductive via 5) may be 10 to 200 μm. The ratio of the depth D of the via hole 7 to the maximum width W of the via hole 7 (hereinafter referred to as "aspect ratio") may be 1 or more, or 2 or more, and may be 10 or less. In order to form the conductive via 5 having a large height or a large aspect ratio, it is necessary to form the via hole 7 having a large depth D or a large aspect ratio. Even in such a case, the via hole can be efficiently and easily formed by the imprint method.

The base material 1 is not particularly limited, but may be a base material for temporary fixing having a temporary fixing material layer separated from the sealing resin layer 3 after the conductive via 5 is formed. The temporary fixing material layer is peeled from the sealing resin layer 3 by, for example, heating, light irradiation, or mechanical peeling. If the sealing resin layer 3 remains at the bottom of the via hole 7, it may be removed by grinding. Thus, a flat circuit surface in which the conductive vias 5 are exposed can be formed. Alternatively, the base material 1 may be a circuit substrate (for example, a printed wiring board) on which an electronic component is mounted.

Figure 3:
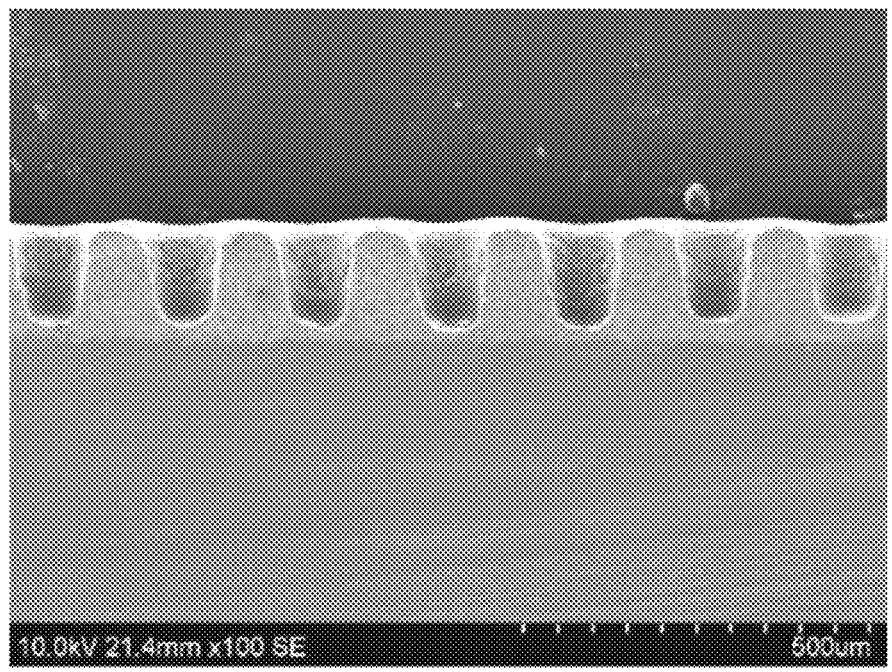
FIG. 3 is a photograph of an example of a sealing resin layer in which via holes are formed.

After the via hole 7 is formed, the sealing resin layer 3A is cured (FIG. 1(c)). The curing is typically thermal curing. FIG. 3 is a photograph of an example of a sealing resin layer in which a via hole is formed. In the example of FIG. 3, a plurality of via holes are formed in the sealing resin layer provided on the silicon substrate as the base material 1. The via hole was formed by an imprint method using a mold having cylindrical protrusions with a diameter of 100 μm.

The via hole 7 of the cured sealing resin layer 3 is filled with the conductor precursor 5A (FIG. 2(d)). However, the sealing resin layer 3A may be cured after the conductor precursor 5A is filled in the via hole 7. By heating the conductor precursor 5A in the via hole 7, the conductive via 5 is formed (FIG. 2(e)). The via hole 7 may be filled with the conductor precursor 5A by screen printing or the like. The via hole 7 may be filled with the conductor precursor 5A by printing a plurality of times. The via hole 7 may be filled with the conductor precursor 5A under reduced pressure. By heating the conductor precursor 5A in the via hole 7, the conductive via 5 which is a cured body of the conductor precursor 5A can be formed. Thus, the electronic component device 10 having the sealing resin layer 3 and the plurality of conductive vias 5 extending in the thickness direction of the sealing resin layer 3 in the sealing resin layer 3 is obtained.

Figure 4:
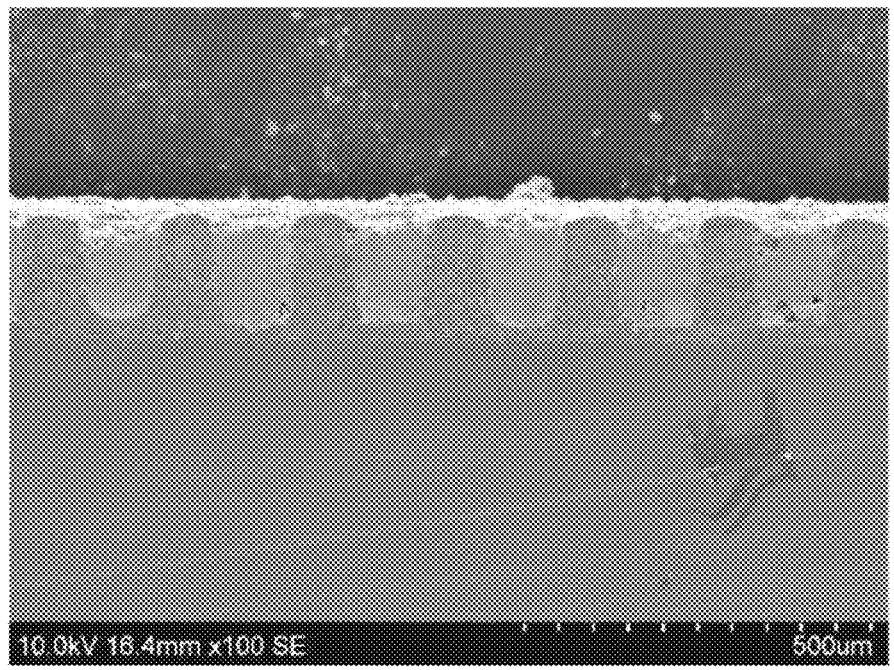
FIG. 4 is a photograph showing an example of a state in which the via hole is filled with the conductor precursor.
Figure 5:
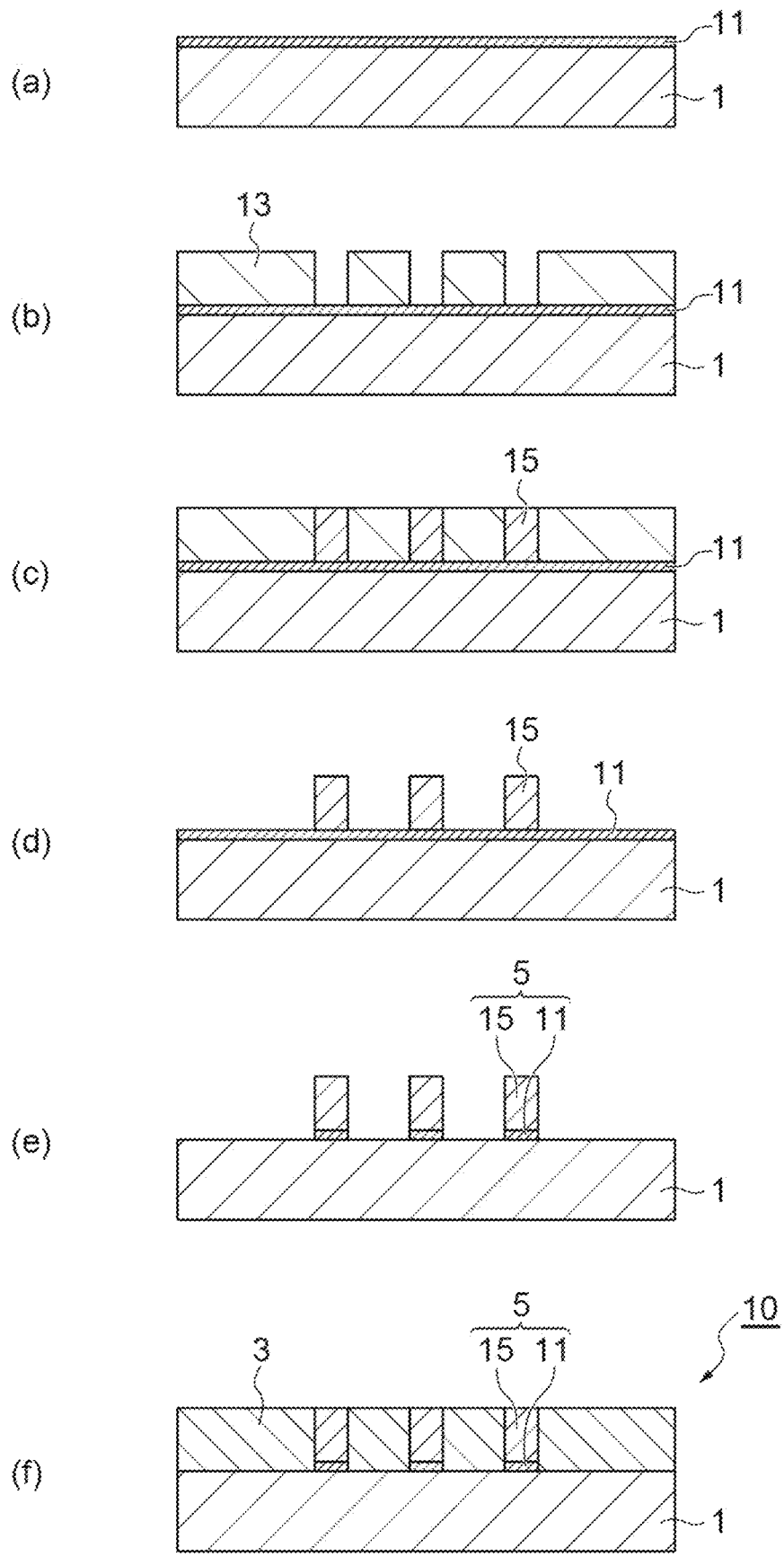
FIG. 5 is a process diagram showing an example of a conventional method of manufacturing an electronic component device.

FIG. 4 is a photograph showing an example of a state in which a conductive via is formed in a via hole. Here, a transitional liquid phase sintering type metallic adhesive described later was used as the conductor precursor, and was filled in the via hole by screen printing under reduced pressure. The filled transitional liquid phase sintering type metal adhesive was sintered by heating, thereby forming a conductive via.

The conductor precursor for the conductive via may be a conductive paste containing a plurality of metallic particles and an organic binder in which the plurality of metallic particles are dispersed. The conductive paste as the conductive precursor may be a transitional liquid phase sintering type metallic adhesive including a plurality of metallic particles capable of transitional liquid phase sintering. In this case, the plurality of metal particles are fused together by sintering of the conductive paste, thereby forming the conductive via 5 which is a conductor including the metal sintered body. Here, "transitional liquid phase sintering" is also referred to as TLPS, and generally refers to sintering that proceeds by transition of a low-melting-point metal to a liquid phase by heating at a grain interface and reaction diffusion of a high-melting-point metal into the formed liquid phase. According to the transitional liquid phase sintering, the melting point of the metal sintered body to be formed can be higher than the heating temperature for sintering.

The plurality of metal particles capable of transitional liquid phase sintering may comprise a combination of a high melting point metal and a low melting point metal. The plurality of metallic particles may separately contain first metallic particles containing high-melting-point metallic particles and second metallic particles containing low-melting-point metallic particles, or the high-melting-point metallic particles and the low-melting-point metallic particles may be contained in one metallic particle.

When the conductor precursor includes a plurality of metallic particles capable of transitional liquid phase sintering, the conductive via 5 may be formed by heating the conductor precursor to a temperature equal to or higher than a liquid phase transition temperature of the plurality of metallic particles. The liquid phase transition temperature can be measured by DSC (Differential scanning calorimetry) under the condition of heating a plurality of metal particles from 25° C. to 300° C. at a heating rate of 10° C./min under a nitrogen gas flow of 50 ml/min. When the metal particles contain a plurality of metals, the temperature of the liquid phase transition observed at the lowest temperature is regarded as the liquid phase transition temperature of the metal particles. For example, the liquid phase transition temperature of the Sn-3.0Ag-0.5Cu alloy is 217° C.

When the plurality of metallic particles capable of transitional liquid phase sintering include a combination of metallic particles of first including metals having high melting points and metallic particles of second including metals having low melting points, the mass ratio of the metallic particles of first to the metallic particles of second may be 2.0 to 4.0 or 2.2 to 3.5.

The metal particles containing a high melting point metal and a low melting point metal can be obtained, for example, by forming a layer containing one metal on the surface of metal particles containing the other metal by plating, vapor deposition, or the like. Metal particles containing one metal and metal particles containing the other metal may be composited by collision or the like.

The high melting point metal may be at least one selected from the group consisting of Au, Cu, Ag, Co and Ni. The low melting point metal may be In, Sn or a combination thereof. Examples of the combination of the high melting point metal and the low melting point metal include a combination of Au and In, a combination of Cu and Sn, a combination of Ag and Sn, a combination of Co and Sn, and a combination of Ni and Sn.

The combination of Cu and Sn produces a copper-tin metal compound ($Cu_6Sn_5$) upon sintering. Since this reaction proceeds at around 250° C., the conductor precursor containing a combination of Cu and Sn can be sintered by heating using general equipment such as a reflow oven. Sn can be contained in the metal particles as a simple substance of Sn metal or as an alloy containing Sn. Examples of the alloy containing Sn include Sn-3.0Ag-0.5Cu alloy. The Sn-3.0Ag-0.5Cu alloy contains 3.0 wt % Ag and 0.5 wt % Cu, based on the weight of the alloy.

The content of the metallic particles in the conductor precursor may be 80% by mass or more, 85% by mass or more, or 88% by mass or more, and may be 98% by mass or less, based on the mass of the conductor precursor. In the case where the conductor precursor contains a solvent described later, the content here is a proportion based on the total mass of components other than the solvent.

The average particle diameter of the metal particles may be 0.5 μm to 80 μm, 1 μm to 50 μm, or 1 μm to 30 μm. Here, the average particle diameter refers to a volume average particle diameter measured by a laser diffraction particle size distribution analyzer (for example, Beckman Coulter, Inc., Model LS 13 320 laser scattering diffraction particle size distribution analyzer).

The organic binder in the conductor precursor may include thermoplastic resin. The thermoplastic resin may have a softening point lower than the liquid phase transition temperature of the metal particles. The softening point of the thermoplastic resin is a value measured by a thermomechanical analysis method. The softening point measured by a thermomechanical analysis method is a temperature at which a displacement of 80 μm is observed when a film having a thickness of 100 μm obtained by forming a film of a thermoplastic resin is compressed in the thickness direction at a stress of 49 mN while being heated at a heating rate of 10° C./min. As the measurement apparatus, for example, a thermomechanical analyzer (TMA 8320, manufactured by Rigaku Corporation, measurement probe: compression loading method standard type) is used.

The softening point of the thermoplastic resin may be 5° C. or more, 10° C. or more, or 15° C. or more lower than the liquid phase transition temperature of the metal particles. The softening point of the thermoplastic resin may be 40° C. or higher, 50° C. or higher, or 60° C. or higher.

The thermoplastic resin may include, for example, at least one selected from the group consisting of a polyamide resin, a polyamideimide resin, a polyimide resin, and a polyurethane resin. The thermoplastic resin may contain a polyoxyalkylene group or a polysiloxane group. The polyoxyalkylene group may be a polyoxyethylene group, a polyoxypropylene group, or a combination thereof.

The thermoplastic resin may be at least one kind of resin selected from the group consisting of a polyamide resin, a polyamideimide resin, a polyimide resin, and a polyurethane resin, each containing a polyoxyalkylene chain or a polysiloxane chain. For example, by using a diamine compound having a polyoxyalkylene group or a polysiloxane group or a diol compound having a polyoxyalkylene group or a polysiloxane group as a monomer, a polyoxyalkylene group or a polysiloxane group can be introduced into these resins.

The content of the thermoplastic resin in the conductor precursor may be 5 to 30 mass %, 6 to 28 mass %, or 8 to 25 mass % based on the mass of the conductor precursor. In the case where the conductor precursor contains a solvent described later, the content here is a proportion based on the total mass of components other than the solvent.

The organic binder may contain a solvent, and may contain a solvent and a thermoplastic resin. The solvent may be a polar solvent. The boiling point of the solvent may be 200° C. or higher and may be 300° C. or lower.

Examples of solvents include alcohols such as terpineol, stearyl alcohol, tripropylene glycol methyl ether, diethylene glycol, diethylene glycol monoethyl ether (ethoxyethoxyethanol), diethylene glycol monohexyl ether, diethylene glycol monomethyl ether, dipropylene glycol n-propyl ether, dipropylene glycol n-butyl ether, tripropylene glycol n-butyl ether, 1,3-butanediol, 1,4-butanediol, propylene glycol phenyl ether, and 2-(2-butoxyethoxy)ethanol; esters such as tributyl citrate, γ-butyrolactone, diethylene glycol monoethyl ether acetate, dipropylene glycol methyl ether acetate, diethylene glycol monobutyl ether acetate, and glycerin triacetate; ketones such as isophorone; lactams such as N-methyl-2-pyrrolidone; nitriles such as phenylacetonitrile; 4-methyl-1,3-dioxolane-2-one; and sulfolane. One kind of solvents may be used alone, or 2 or more kinds of solvents may be used in combination.

The content of the solvent may be 0.1 to 10 mass %, 2 to 7 mass %, or 3 to 5 mass % based on the mass of the conductor precursor.

The organic binder in the conductor precursor may further contain other components such as thermosetting resins, rosins, activators, and thixotropic agents.

Examples of thermosetting resins include epoxy resins, oxazine resins, bismaleimide resins, phenolic resins, unsaturated polyester resins, and silicone resins. Examples of the epoxy resin include a bisphenol A type epoxy resin, a bisphenol F type epoxy resin, a bisphenol S type epoxy resin, a phenol novolac type epoxy resin, a cresol novolac type epoxy resin, a naphthalene type epoxy resin, a biphenol type epoxy resin, a biphenyl novolac type epoxy resin, and a cyclic aliphatic epoxy resin.

Examples of rosins include dehydroabietic acid, dihydroabietic acid, neoabietic acid, dihydropimaric acid, pimaric acid, isopimaric acid, tetrahydroabietic acid, and palustric acid.

Examples of activators include aminodecanoic acid, pentane-1,5-dicarboxylic acid, triethanolamine, diphenylacetic acid, sebacic acid, phthalic acid, benzoic acid, dibromosalicylic acid, anisic acid, iodosalicylic acid, and picolinic acid.

Examples of thixotropic agents include 12-hydroxystearic acid, 12-hydroxystearic acid triglyceride, ethylene bisstearic acid amide, hexamethylene bisoleic acid amide, and N,N'-distearyladipic acid amide.

The conductor precursor can be obtained by mixing metallic particles and components constituting an organic binder. The apparatus for mixing may be, for example, a three roll mill, a planetary mixer, a planetary mixer, a planetary stirrer, a planetary stirrer, a kneader, a two shaft kneader, or a thin-layer shear disperser.

The electronic component sealed by the sealing resin layer 3 may be a semiconductor device or a combination of a semiconductor device and a passive component. The semiconductor element may be an IC chip. The passive component may be a capacitor, for example.

REFERENCE SIGNS LIST

1: base material, 3: sealing resin layer (after curing), 3A: sealing resin layer (before curing), 5: conductive via, 5A: conductor precursor, 7: via hole, 8: mold, 10: electronic component device, 20: semiconductor element.

The invention claimed is:

1. A method for manufacturing an electronic component device, the method comprising:
 forming a via hole extending in a thickness direction of a curable sealing resin layer provided on a base material by an imprint method of pressing a mold into the sealing resin layer from a side opposite to the base material, wherein a semiconductor element is provided on the base material, and the semiconductor element is sealed by the sealing resin layer;

curing the sealing resin layer;

filling the via hole with a conductor precursor; and forming a conductive via by heating the conductor precursor filled in the via hole, wherein the via hole has a depth of 30 to 500 µm.

2. The method according to claim 1, wherein a ratio of the depth of the via hole to a maximum width of the via hole is 1 or more.

3. The method according to claim 2, wherein the ratio of the depth of the via hole to the maximum width of the via hole is 10 or less.

4. The method according to claim 1, wherein a ratio of the depth of the via hole to a maximum width of the via hole is 2 or more.

5. The method according to claim 4, wherein the ratio of the depth of the via hole to the maximum width of the via hole is 10 or less.

6. The method according to claim 4, wherein the maximum width of the via hole is 10 to 200 µm.

7. The method according to claim 1, wherein the curable sealing resin layer is cured prior to filling the via hole with the conductor precursor.

8. A method for manufacturing an electronic component device, the method comprising:

forming a via hole extending in a thickness direction of a curable sealing resin layer provided on a base material by an imprint method of pressing a mold into the sealing resin layer from a side opposite to the base material, wherein a semiconductor element is provided on the base material, and the semiconductor element is sealed by the sealing resin layer;

curing the sealing resin layer;

filling the via hole with a conductor precursor, wherein the conductor precursor comprises a plurality of metallic particles and an organic binder in which the plurality of metallic particles are dispersed; and forming a conductive via by heating the conductor precursor filled in the via hole, wherein the via hole has a depth of 30 to 500 µm, wherein when the conductor precursor is heated, the plurality of metallic particles form a metallic sintered body through transitional liquid phase sintering, thereby forming the conductive via comprising the metallic sintered body.

9. A method for manufacturing an electronic component device, the method comprising:

forming a via hole extending in a thickness direction of a curable sealing resin layer provided on a base material by an imprint method of pressing a mold into the sealing resin layer from a side opposite to the base material;

curing the sealing resin layer;

filling the via hole with a conductor precursor, wherein the conductor precursor comprises a plurality of metallic particles and an organic binder in which the plurality of metallic particles are dispersed, and the organic binder comprises a thermoplastic resin having a polyoxyalkylene group or a polysiloxane group; and forming a conductive via by heating the conductor precursor filled in the via hole, wherein the via hole has a depth of 30 to 500 µm.

10. A method for manufacturing an electronic component device, the method comprising:

forming a via hole extending in a thickness direction of a curable sealing resin layer provided on a base material by an imprint method of pressing a mold into the sealing resin layer from a side opposite to the base material;

filling the via hole with a conductor precursor;

curing the sealing resin layer, wherein the sealing resin layer is cured after filling the via hole with the conductor precursor; and forming a conductive via by heating the conductor precursor filled in the via hole, wherein the via hole has a depth of 30 to 500 µm.

* * * * *